US008952399B2

(12) United States Patent
Odnoblyudov et al.

(10) Patent No.: US 8,952,399 B2
(45) Date of Patent: Feb. 10, 2015

(54) LIGHT EMITTING DEVICE COMPRISING A WAVELENGTH CONVERSION LAYER HAVING INDIRECT BANDGAP ENERGY AND MADE OF AN N-TYPE DOPED ALINGAP MATERIAL

(75) Inventors: Vladimir Odnoblyudov, Eagle, ID (US); Martin F. Schubert, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 13/156,059

(22) Filed: Jun. 8, 2011

(65) Prior Publication Data

US 2012/0313125 A1 Dec. 13, 2012

(51) Int. Cl.
*H01L 29/20* (2006.01)

(52) U.S. Cl.
USPC ............ 257/89; 257/76; 257/79; 257/102; 257/103; 257/E33.061

(58) Field of Classification Search
CPC ............ H01L 33/15; H01L 2933/0041; H01L 33/502
USPC ............ 257/101, 89, 13, 98, 76, 86, 79, 102
See application file for complete search history.

(56) References Cited

U.S. PATENT DOCUMENTS

| 6,163,037 A * | 12/2000 | Matsumoto et al. ......... 257/101 |
| 7,045,375 B1 | 5/2006 | Wu et al. |
| 7,652,281 B2 | 1/2010 | Takahashi et al. |
| 2005/0051790 A1 * | 3/2005 | Ueda ......................... 257/99 |
| 2007/0223219 A1 | 9/2007 | Medendorp, Jr. et al. |
| 2008/0217639 A1 * | 9/2008 | Kim et al. ..................... 257/98 |
| 2009/0014744 A1 | 1/2009 | Hsieh et al. |
| 2010/0090232 A1 | 4/2010 | Huang et al. |
| 2010/0289044 A1 | 11/2010 | Krames et al. |

FOREIGN PATENT DOCUMENTS

| EP | 2237329 A2 | 10/2010 |
| KR | 20010084332 A | 9/2001 |
| KR | 100564303 B1 | 3/2006 |

OTHER PUBLICATIONS

J. Appl. Phys. 98, 086101 (2005) P. Altieri. et al. Effect of V/III ratio on the lectrical and optical properties of Si dopes AlGaInP grown by metalorganic chemical vapor deposition.*
Journal of Crystal Growth 148 (1995) 13-16. Yu Qingxuan et al. Internal quantum efficiency of high-brightness AlGaInP light emitting devices.*

(Continued)

*Primary Examiner* — Marcos D. Pizarro
*Assistant Examiner* — Cesar Lopez
(74) *Attorney, Agent, or Firm* — Perkins Coie LLP

(57) ABSTRACT

Various embodiments of light emitting devices with efficient wavelength conversion and associated methods of manufacturing are described herein. In one embodiment, a light emitting device includes a first semiconductor material, a second semiconductor material spaced apart from the first semiconductor material, and an active region between the first and second semiconductor materials. The active region is configured to produce a light via electroluminescence. The light emitting device also includes a conversion material on the second semiconductor material, the conversion material containing aluminum gallium indium phosphide (AlGaInP) doped with an N-type dopant.

11 Claims, 6 Drawing Sheets

(56) References Cited

OTHER PUBLICATIONS

Altieri, P. et al., "Internal Quantum Efficiency of High-Brightness AlGaInP Light-Emitting Devices," J. Appl. Phys. 98, 086101-3 (2005), DOI: 10.1063/1.2085308.*

2002 Sze, S. M Semiconductor devices, physics and technology—2nd ed.ISBN 0-471-33:372-7 p. 32, 292. John Wiley & Sons, Inc.*

Qingxuan, Y. et al., "Effect of V/III Ratio on the Electrical and Optical Properties of Si-Doped AlGaInP Grown by Metalorganic Chemical Vapor Deposition," Journal of Crystal Growth 148 (1995) pp. 13-16, DOI: 10.1016/0022-0248(94)00581-8.*

Isao Hino, et al., "High Aluminum Composition AlGaInP Grown by Metalorganic Chemical Vapor Deposition—Impurity Doping and 590 nm (Orange) Electroluminescence—" Jpn. J. Appl. Phys. 23 (1984) pp. L746-L748 DOI: 10.1143/JJAP.23.L746.*

Gessmann, Th. and Schubert, E. F. "High-Efficiency AlGaInP Light-Emitting Diodes for Solid-State Lighting Applications." Journal of Applied Physics. Mar. 1, 2004. vol. 95. No. 5. pp. 2203-2216.

Streetman, B. Solid State Devices, 4th Edition. Prentice-Hall. pp. 56-59. Jan. 1997.

International Search Report and Written Opinion issued Oct. 31, 2012 in International Application No. PCT/US2012/040260, 7 pages.

* cited by examiner

US 8,952,399 B2

LIGHT EMITTING DEVICE COMPRISING A WAVELENGTH CONVERSION LAYER HAVING INDIRECT BANDGAP ENERGY AND MADE OF AN N-TYPE DOPED ALINGAP MATERIAL

TECHNICAL FIELD

The present disclosure is related to light emitting devices with efficient wavelength conversion and associated methods.

BACKGROUND

Light emitting diodes ("LEDs") and other types of light emitting devices are widely used for background illumination in electronic devices and for signage, indoor lighting, outdoor lighting, and other types of general illumination. Such light emitting devices typically emit at only one center wavelength and thus do not produce white light. One conventional technique for emulating white light with LEDs includes depositing a phosphor on an LED die. FIG. 1A shows a conventional light emitting device 10 that has a support 2 carrying both an LED die 4 and a phosphor 6. As shown in FIG. 1B, one example LED die 4 can include a substrate 12, an N-type gallium nitride (GaN) material 14, GaN/indium gallium nitride (InGaN) multiple quantum wells ("MQWs") 16, a P-type GaN material 18, a first contact 20, and a second contact 22.

Referring to both FIGS. 1A and 1B, in operation, an electrical voltage is applied between the first and second contacts 20 and 22. In response to the applied voltage, the MQWs 16 of the LED die 4 produce a first emission (e.g., a blue light). The phosphor 6 absorbs a portion of the first emission and "converts" it into a second emission (e.g., a yellow light). The combination of the first and second emissions can appear white to human eyes if matched appropriately. As discussed in more detail below, using phosphors to "convert" the first emission has certain drawbacks.

DETAILED DESCRIPTION

Various embodiments of light emitting devices with semiconductor conversion materials and associated methods of manufacturing are described below. As used hereinafter, the term "light emitting device" generally refers to LEDs, laser diodes, and/or other suitable sources of illumination other than electrical filaments, a plasma, or a gas. A person skilled in the relevant art will also understand that the technology may have additional embodiments, and that the technology may be practiced without several of the details of the embodiments described below with reference to FIGS. 2A-6.

Figure 2A:
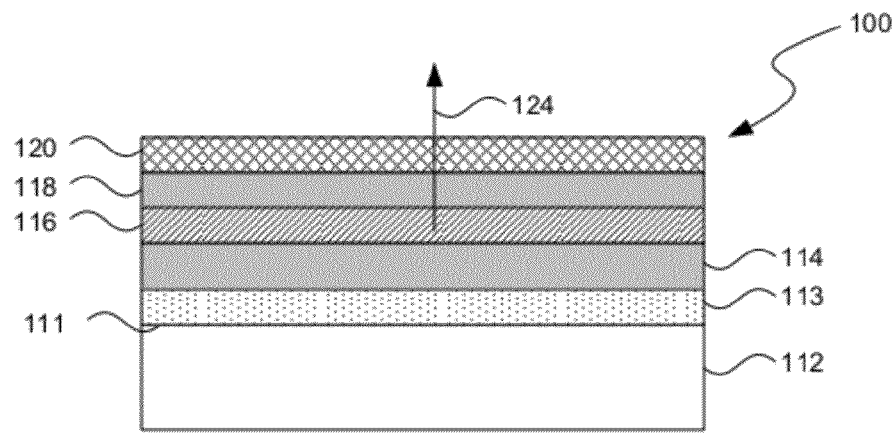
FIG. 2A is a schematic cross-sectional diagram of a light emitting device with a semiconductor conversion material in accordance with embodiments of the technology.

FIG. 2A is a schematic cross-sectional diagram of a light emitting device 100 with a semiconductor conversion material in accordance with embodiments of the technology. As shown in FIG. 2A, the light emitting device 100 can include a substrate material 112, an optional buffer material 113, a first semiconductor material 114, an active region 116, a second semiconductor material 118, and a semiconductor conversion material 120. Even though only one semiconductor conversion material 120 is shown in FIG. 2A for illustration purposes, in other embodiments, the light emitting device 100 may include two, three, four, or any other suitable number of conversion materials (not shown) with different emission center wavelengths and/or other characteristics. In further embodiments, the light emitting device 100 can include electrical contacts (e.g., gold contacts and/or transparent conductive contacts), a reflective material (e.g., a silver film), a carrier material (e.g., a ceramic substrate), an optical component (e.g., a collimator), and/or other suitable components.

In certain embodiments, the first semiconductor material 114 can be grown on the substrate material 112. For example, the substrate material 112 can include silicon (Si), at least a portion of which has the Si(1,1,1) crystal orientation, silicon with other crystal orientations (e.g., Si(1,0,0)), gallium arsenide (GaAs), AlGaN, GaN, silicon carbide (SiC), sapphire ($Al_2O_3$), zinc oxide ($ZnO_2$), a combination of the foregoing materials, and/or other suitable substrate materials or engineered substrates. In the illustrated embodiment, the substrate material 112 has a generally planar surface 111 proximate to the optional buffer material 113. In other embodiments, the substrate material 112 may also include a non-planar surface (e.g., having openings, channels, textures, and/or other surface features, not shown). In other embodiments, the first semiconductor material 114 can be grown on a different substrate and then bonded or otherwise attached to the substrate material 112. The substrate material 112 can be made from a dielectric, conductive or semiconductive material in such embodiments.

As shown in FIG. 2A, the light emitting device 100 includes the optional buffer material 113 can be configured to facilitate formation of the first and second semiconductor materials 114 and 118 and the active region 116 on the substrate material 112. The optional buffer material 113 can include at least one of aluminum nitride (AlN), aluminum-gallium nitride (AlGaN), zinc nitride (ZnN), GaN, and/or other suitable materials. In other embodiments, the optional buffer material 113 may be omitted, and the first semiconductor material 114 may be formed directly on the surface 111 of the substrate material 112. In yet further embodiments, other intermediate materials (e.g., zinc oxide ($ZnO_2$)) may be formed on the substrate material 112 in addition to or in lieu of the optional buffer material 113.

The first and second semiconductor materials 114 and 118 can be configured as cladding structures for the active region 116. In certain embodiments, the first semiconductor material 114 can include an N-type GaN material (e.g., doped with silicon (Si)), and the second semiconductor material 118 can include a P-type GaN material (e.g., doped with magnesium (Mg)). In other embodiments, the first semiconductor material 114 can include a P-type GaN material, and the second semiconductor material 118 can include an N-type GaN material. In further embodiments, the first and second semiconductor materials 114 and 118 can include AlGaN, aluminum gallium arsenic (AlGaAs), gallium arsenide phosphide (GaAsP), gallium(III) phosphide (GaP), zinc selenide (ZnSe), boron nitride (BN), and/or other suitable semiconductor materials.

The active region 116 can include a single quantum well ("SQW"), MQWs, and/or a bulk semiconductor material configured to produce a first emission via electroluminescence. As used hereinafter, a "bulk semiconductor material" generally refers to a single grain semiconductor material (e.g., InGaN) with a thickness greater than about 10 nanometers and up to about 500 nanometers. In certain embodiments, the active region 116 can include an InGaN SQW, InGaN/GaN MQWs, and/or an InGaN bulk material. In other embodiments, the active region 116 can include aluminum gallium indium phosphide (AlInGaP), aluminum gallium indium nitride (AlGaInN), and/or other suitable materials or configurations. In any of the foregoing embodiments, the first semiconductor material 114, the active region 116, the second semiconductor material 118, and the optional buffer material 113 can be formed on the substrate material 112 via metal organic chemical vapor deposition ("MOCVD"), molecular beam epitaxy ("MBE"), liquid phase epitaxy ("LPE"), hydride vapor phase epitaxy ("HVPE"), and/or other suitable epitaxial growth techniques.

The semiconductor conversion material 120 can be configured to "convert" at least a portion of the first emission to a second emission via photoluminescence. In one embodiment, the semiconductor conversion material 120 may include a generally homogeneous bulk material (e.g., AlInGaP) with one or more N-type dopants formed via doping, ion implantation, and/or other suitable techniques, as described in more detail below with reference to FIG. 2B. The N-type dopant can include at least one of the Group IV elements (e.g., silicon (Si), germanium (Ge), and tin (Sn)) and/or other suitable compositions.

In other embodiments, the semiconductor conversion material 120 can include a plurality of epitaxial materials individually having a thickness and/or a select bandgap energy. At least one of the epitaxial materials may be configured to efficiently absorb a portion of the first emission at a first wavelength. At least another may be configured to efficiently produce the second emission at a second wavelength longer than the first wavelength. One example of such a semiconductor conversion material 120 is described in more detail below with reference to FIG. 2C. In further embodiments, the semiconductor conversion material 120 can include a bulk material (e.g., AlInGaP) with one or more N-type dopants having graduated dopant concentrations, as described in more detail below with reference to FIG. 2D. In yet further embodiments, the semiconductor conversion material 120 can include a combination of the foregoing structures and/or compositions.

In operation, an electrical voltage is applied and an electrical current (not shown) flows through the first semiconductor material 114, the active region 116, and the second semiconductor material 118. In response to the applied voltage and resulting current, the active region 116 produces the first emission (e.g., a blue light) with a first center wavelength (e.g., 450 nm). The first emission passes through the second semiconductor material 118 to reach the semiconductor conversion material 120 as indicated by an emission direction generally represented by the arrow 124.

In one embodiment, a first portion of the first emission then passes through the semiconductor conversion material 120 to an external environment. The semiconductor conversion material 120 absorbs a second portion of the first emission and emits the second emission (e.g., a green-yellow light) with a second center wavelength (e.g., in the 550 nm-590 nm range). The combined first and second emissions with certain desired characteristics (e.g., appearing white or other colors to human eyes) are then emitted to the external environment. In another example, the semiconductor conversion material 120 can generally completely absorb the first emission and emits the second emission with the second center wavelength to the external environment via photoluminescence. The first portion of the first emission may have approximately zero intensity in this case.

In certain embodiments, the ratio between the first and second portions of the first emission may be controlled by adjusting a thickness of the semiconductor conversion material 120. For example, if the thickness of the semiconductor conversion material 120 is increased from a first thickness to a second thickness, more of the first emission may be absorbed. As a result, the intensity of the second emission increases, and the intensity of the first emission decreases. In other embodiments, the ratio between the first and second portions of the first emission may be controlled by adjusting a transparency, a light scattering characteristic, and/or other properties of the semiconductor conversion material 120.

Figure 2B:
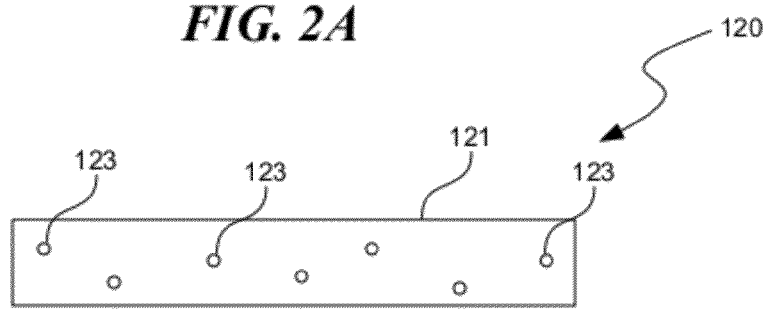
FIGS. 2B-2D are schematic cross-sectional diagrams of a semiconductor conversion material in the light emitting device of FIG. 2A in accordance with additional embodiments of the technology.
Figure 2C:
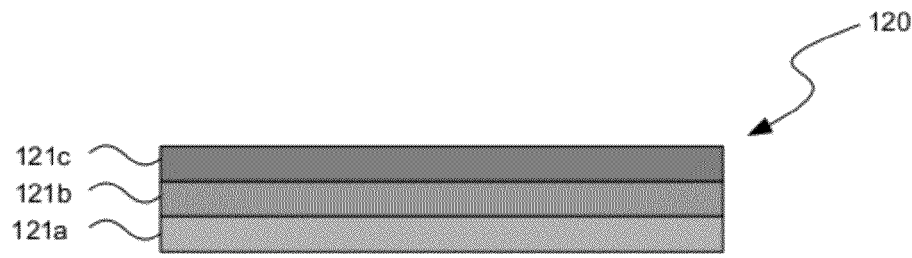
Figure 2D:
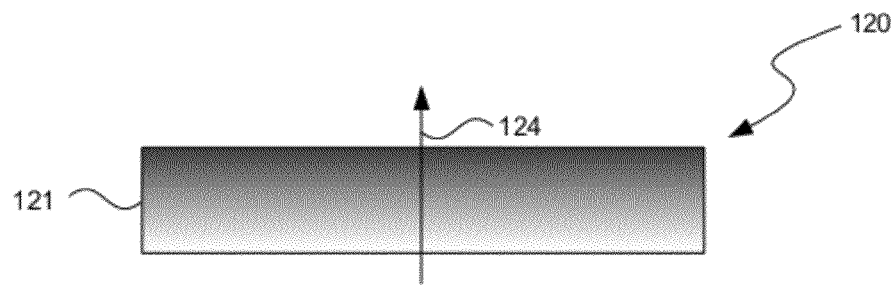

FIGS. 2B-2D are schematic cross-sectional diagrams of embodiments of the semiconductor conversion material 120 in accordance with the technology. The embodiment of the semiconductor conversion material 120 shown in FIG. 2B includes a single epitaxial material 121 with an N-type dopant 123. FIG. 2C shows a different embodiment in which the semiconductor conversion material 120 includes a plurality of epitaxial materials 121 (e.g., first, second, and third epitaxial materials 121a, 121b, and 121c, respectively). The epitaxial materials 121 can individually contain an N-type dopant with a select composition and/or concentration. As a result, the first, second, and third epitaxial materials 121a, 121b, and 121c can individually have a particular bandgap energy different than others. In further embodiments, as shown in FIG. 2D, the semiconductor conversion material 120 can include a single epitaxial material 121 containing an N-type dopant with graduated doping concentrations (as represented by the shading) with respect to the emission direction 124.

It has been recognized that one material system suitable for forming the semiconductor conversion material 120 is an AlInGaP matched to a GaAs (growth substrate) lattice system. The inventors also recognized that native (i.e., undoped) AlInGaP lattice systems may have low radiative recombination efficiencies under certain conditions and in certain wavelength ranges less than about 600 nm. Such low radiative recombination may be improved by doping the AlInGaP lattice system with an N-type dopant, as explained in more detail below with reference to FIGS. 3A-4C.

Figure 3A:
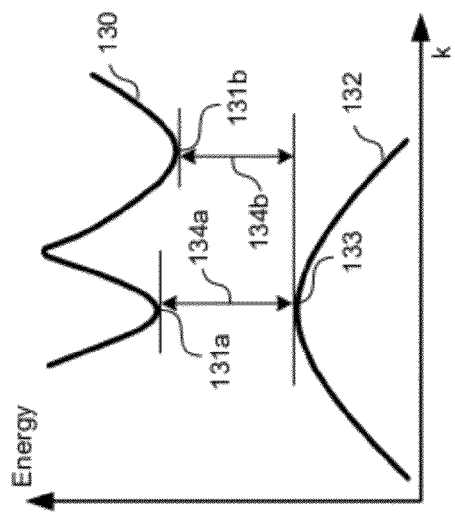
FIGS. 3A-3C are energy versus crystal momentum (k-vector) diagrams of an AlInGaP lattice system with different compositions in accordance with embodiments of the technology.
Figure 3B:
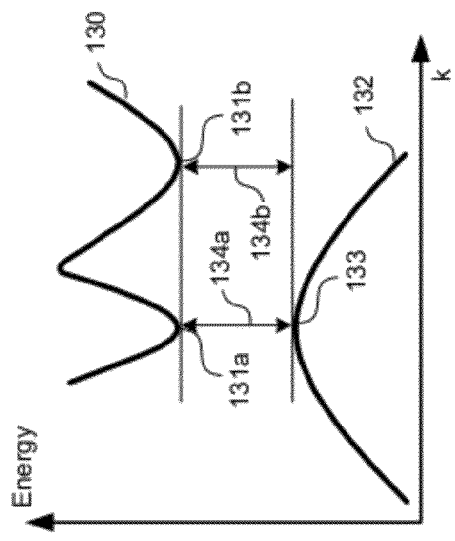
Figure 3C:
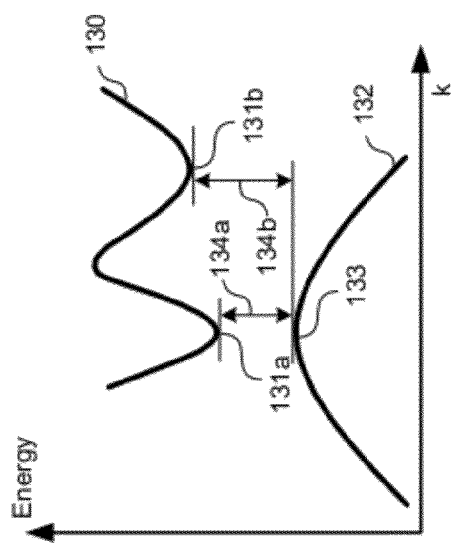

FIGS. 3A-3C are energy versus crystal momentum (k-vector) diagrams of an AlInGaP lattice system with different compositions in accordance with embodiments of the technology. Even though the AlInGaP lattice system is used as an example to illustrate various embodiments of the present technology, one of ordinary skill in the art will understand that such doping scheme may also be applied to other suitable material systems with similar bandgap properties.

Without being bound by theory, it is believed that the AlInGaP lattice system can have different relationships between a direct bandgap energy and an indirect bandgap energy based on a concentration of aluminum (Al) in the AlInGaP lattice system. As used herein, a "direct bandgap" generally refers to a bandgap in which the maximum energy state in the valence band has the same crystal momentum (k-vector) as the minimum energy state in the conduction band. An "indirect bandgap" generally refers to a bandgap in which the maximum energy state in the valence band has a different crystal momentum (k-vector) than that of the minimum energy state in the conduction band.

For example, as shown in FIGS. 3A-3C, the AlInGaP lattice system can include a conduction band 130 and a valence band 132 spaced apart from each other. The conduction band 130 includes a first minimum energy state 131a and a second minimum energy state 131b along the k-vector axis. The valence band 132 includes a maximum energy state 133 that has the same k-vector as the first minimum energy state 131a of the conduction band 130. As a result, the first minimum energy state 131a and the maximum energy state 133 form a direct bandgap 134a with a direct energy gap of $E_{g\_direct}$. The second minimum energy state 131b and the maximum energy state 133 form an indirect bandgap 134b with an indirect energy gap of $E_{g\_indirect}$.

Without being bound by theory, it is believed that as the aluminum (Al) concentration in the AlInGaP lattice system changes, the relationship between the direct energy gap $E_{g\_direct}$ and the indirect energy gap of $E_{g\_indirect}$ also varies. For example, as shown in FIG. 3A, at a first aluminum concentration, the direct energy gap of $E_{g\_direct}$ is less than the indirect energy gap of $E_{g\_indirect}$. As shown in FIG. 3B, at a second aluminum concentration different than the first aluminum concentration, the direct energy gap of $E_{g\_direct}$ is generally equal to the indirect energy gap of $E_{g\_indirect}$. As shown in FIG. 3C, at a third aluminum concentration different than both the first and second aluminum concentrations, the direct energy gap of $E_{g\_direct}$ is greater than the indirect energy gap of $E_{g\_indirect}$.

Figure 4B:
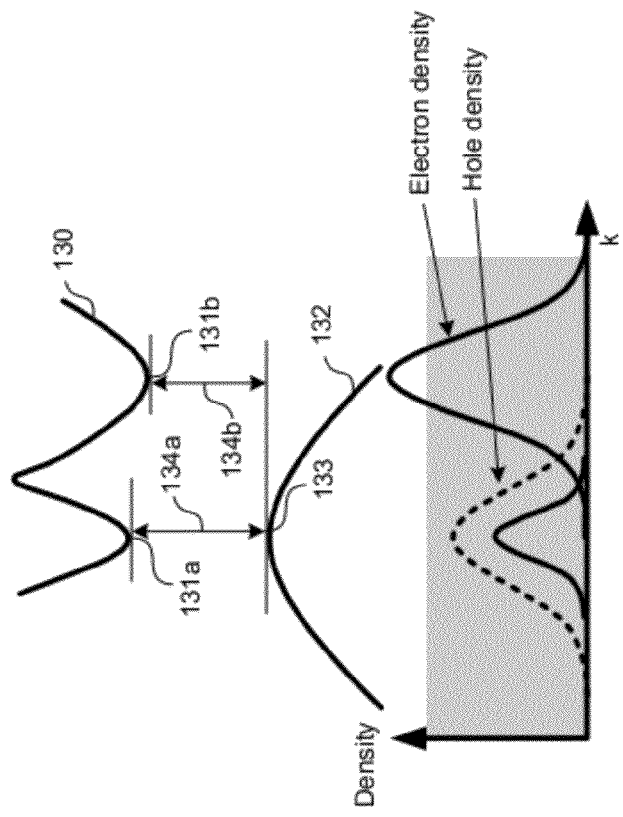
FIGS. 4A and 4B are charge carrier density versus crystal momentum diagrams of the AlInGaP lattice system in FIG. 3C undoped and doped, respectively, in accordance with embodiments of the technology.
Figure 4A:
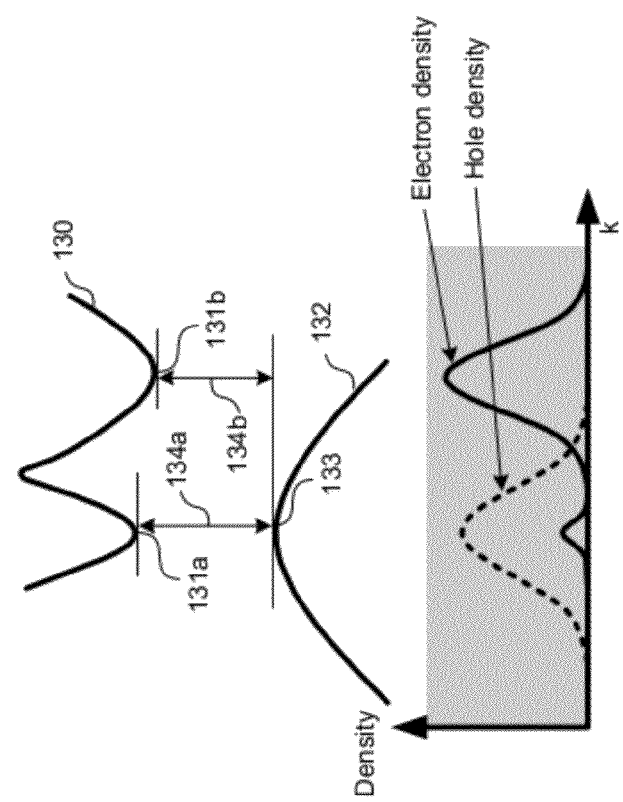

The variation in the relationship between the direct energy gap $E_{g\_direct}$ and the indirect energy gap $E_{g\_indirect}$ can influence a radiative recombination rate in the AlInGaP lattice system. FIGS. 4A and 4B are charge carrier density versus crystal momentum diagrams of the AlInGaP lattice system in FIG. 3C when undoped and doped, respectively, in accordance with embodiments of the technology. Referring to FIG. 4A, when the AlInGaP lattice system is undoped, if a non-equilibrium population of charge carriers (i.e., electrons and holes) is created (e.g., via photoluminescence) and allowed to thermally equalize within the conduction band 130 and the valence band 132 without recombining, the charge carriers are believed to have a distribution in k-vector. This shows that a first number of electrons in the first minimum energy state 131a is much less than a second number of electrons in the second minimum energy state 131b due at least in part to the higher direct energy gap of $E_{g\_direct}$ than the indirect energy gap of $E_{g\_indirect}$. It is also believed that a radiative recombination rate is generally proportional to a product of electron and hole densities in the direct bandgap 134a. As a result, when the AlInGaP lattice system is undoped, the radiative recombination rate can be low because the electron density corresponding to the direct bandgap 134a is low.

Figure 1A:
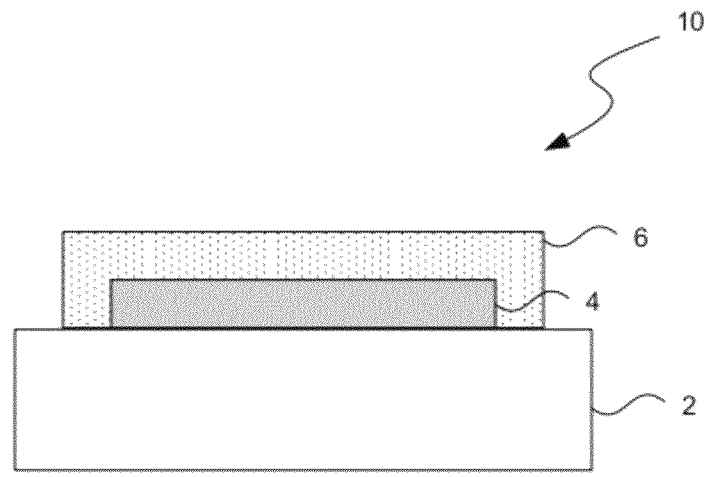
FIG. 1A is a schematic cross-sectional diagram of a light emitting device in accordance with the prior art.

Referring to FIG. 4B, the inventors have discovered that the low radiative recombination rate in the undoped AlInGaP lattice system may be improved by doping the AlInGaP lattice system with an N-type dopant. Doping the AlInGaP lattice system with an N-type dopant may increase the electron density in the first minimum energy state 131a compared to the undoped AlInGaP lattice system shown in FIG. 1A. As a result, the radiative recombination rate in the direct bandgap 134a may be increased. FIG. 4B also shows that the electron density in the second minimum energy state 131b is also increased when compared to the undoped AlInGaP lattice system. However, it is believed that the non-radiative recombination across the indirect bandgap 134b has a weaker dependence on the electron density because such a process is phonon and/or dislocation assisted. Thus, the radiative rate across the direct bandgap 134a may be increased when compared to the undoped AlInGaP lattice system.

Further, it is believed that recombination across the direct bandgap 134a is more efficient that radiative recombination across the indirect bandgap 134b. As a result, as the electron density in the first minimum energy state 131a is depleted via radiative recombination across the direct bandgap 134a, electrons in the second minimum energy state 131b may be transferred to the first minimum energy state 131a via thermal equalization and/or other suitable mechanisms. Accordingly, the radiative recombination in the AlInGaP lattice system may be further improved.

Figure 5:
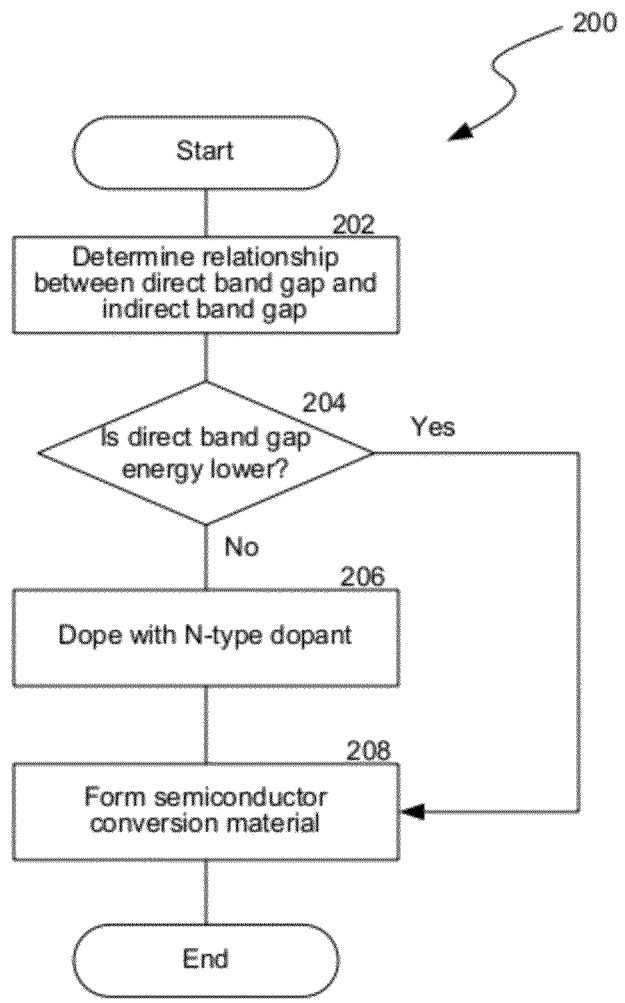
FIG. 5 is a flowchart illustrating a method for forming embodiments of the light emitting device of FIG. 2A in accordance with embodiments of the technology.

FIG. 5 is a flowchart illustrating a method 200 for forming embodiments of the light emitting device 100 in FIG. 2A in accordance with embodiments of the technology. In one embodiment, the method 200 includes determining a relationship in energy between a direct bandgap and an indirect bandgap (block 202). The direct bandgap can have an energy value less than, equal to, or greater than that of the indirect bandgap.

The method 200 further includes determining whether the direct bandgap has an energy value lower than that of the indirect bandgap (block 204). If the direct bandgap has an energy value smaller than that of the indirect bandgap, the process proceeds to forming the semiconductor conversion material (block 208). In one embodiment, the semiconductor conversion material may be formed via MOCVD, MBE, LPE, HVPE, and/or other suitable epitaxial growth techniques. In other embodiments, the semiconductor conversion material may be formed via bonding (e.g., with or without an adhesive), mechanical fastening, and/or other suitable techniques.

If the direct bandgap does not have an energy value smaller than that of the indirect bandgap, the process proceeds to doping the semiconductor conversion material with an N-type dopant (block 206) via ion implantation and/or other suitable techniques. In one embodiment, doping the semiconductor conversion material includes determining a concentration of the N-type dopant. Without being bound by theory, higher the N-type dopant concentrations are expected to produce higher the radiative recombination rates across the direct bandgap. However, introducing a high level of N-type dopant may negatively affect the crystal quality of the semiconductor conversion material. For example, high N-type dopant concentrations may cause solid phase precipitation and/or other defects in the semiconductor conversion material. As a result, it is believed that the N-type dopant may not have a concentration higher than a threshold value. Example ranges of the N-type dopant may include about $-10^{18}/cm^3$ to about $10^{19}/cm^3$. After doping with the N-type dopant, the process proceeds to forming the semiconductor conversion material (block 208).

Figure 6:
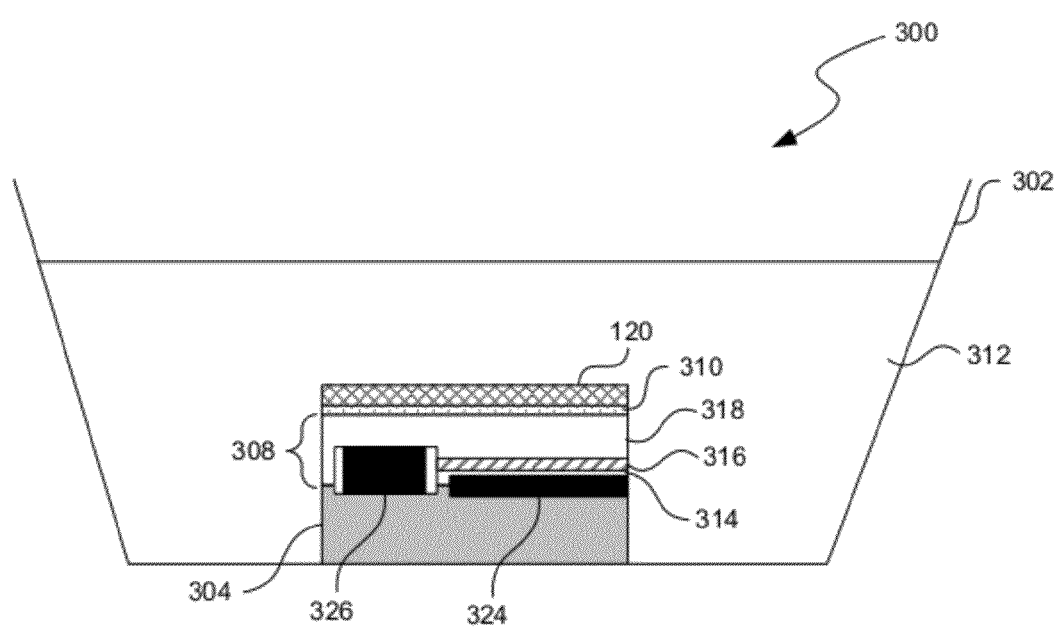
FIG. 6 is a schematic cross-sectional diagram of a light emitting package incorporating the semiconductor conversion material of FIGS. 2B-2D in accordance with embodiments of the technology.

Embodiments of the semiconductor conversion material 120 discussed above with reference to FIGS. 2B-2D may be incorporated in various light emitting packages. For example, FIG. 6 is a schematic cross-sectional diagram of a light emitting package 300 incorporating the semiconductor conversion material of FIGS. 2B-2D in accordance with embodiments of the technology. As shown in FIG. 6, the light emitting package 300 can include a housing 302, a support 304, an LED die 308 carried by the support 304, a semiconductor conversion material 120 attached to the LED die 308 with an optional transparent adhesive 310, and a phosphor 312 in the housing 302. In certain embodiments, the optional transparent adhesive 310 can include a polyamide, silicon oxide ($SiO_2$), and/or other suitable adhesive materials. In other embodiments, the optional transparent adhesive 310 may be omitted, and the semiconductor conversion material 120 may be attached to the LED die 308 directly (e.g., formed on the LED die 308).

Figure 1B:
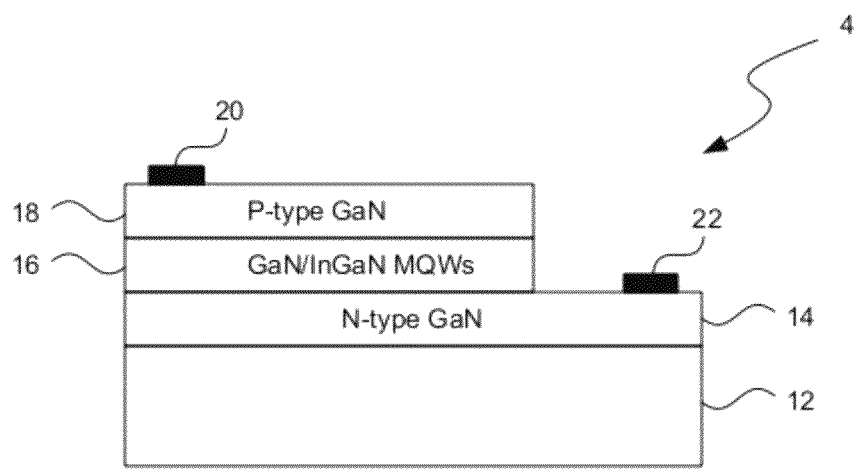
FIG. 1B is a schematic cross-sectional diagram of an LED die in accordance with the prior art.

The LED die 308 can have a configuration generally similar to the LED die 4 shown in FIG. 1B. For example, the LED die 308 can include a first semiconductor material 314, an active region 316, and a second semiconductor material 318 arranged in series. The LED die 308 can also include a first contact 324 and a second contact 326 electrically coupled to the first and second semiconductor materials 314 and 318, respectively.

The phosphor 312 can have a composition that emits at a desired wavelength under stimulation. For example, in one embodiment, the phosphor 312 can include Cerium(III)-doped Yttrium Aluminum Garnet ("YAG") at a particular concentration. Such a converter material 104 can emit a broad range of colors from green to yellow and to red under photoluminescence. In other embodiments, the phosphor 312 can include neodymium-doped YAG, neodymium-chromium double-doped YAG, erbium-doped YAG, ytterbium-doped YAG, neodymium-cerium double-doped YAG, holmium-chromium-thulium triple-doped YAG, thulium-doped YAG, chromium(IV)-doped YAG, dysprosium-doped YAG, samarium-doped YAG, terbium-doped YAG, and/or other suitable phosphor compositions. In yet other embodiments, the phosphor 312 can include Europium phosphors (e.g., $CaS:Eu$, $CaAlSiN_3:Eu$, $Sr_2Si_5N_8:Eu$, $SrS:Eu$, $Ba_2Si_5N_8:Eu$, $Sr_2SiO_4:Eu$, $SrSi_2N_2O_2:Eu$, $SrGa_2S_4:Eu$, $SrAl_2O_4:Eu$, $Ba_2SiO_4:Eu$, $Sr_4Al_{14}O_{25}:Eu$, $SrSiAl_2O_3N:Eu$, $BaMgAl_{10}O_{17}:Eu$, $Sr_2P_2O_7:Eu$, $BaSO_4:Eu$, and/or $SrB_4O_7:Eu$).

In operation, an electrical voltage applied to the LED die 308 via the first and second contacts 324 and 326 produces a first emission (e.g., a blue light). As discussed above, the semiconductor conversion material 120 can absorb at least a portion of the first emission and produce a second emission (e.g., a red light) at a different center wavelength. The phosphor 312 can then absorb a portion of the remaining first emission and produce a third emission at a yet different center wavelength (e.g., a yellow light). The combination of the first, second, and third emissions are then emitted from the light emitting package 300 to an external environment.

In the light emitting package 300, at least one of the emission characteristics of the LED die 308, the semiconductor conversion material 120, and the phosphor 312 may be adjusted to achieve a target color rendering index ("CRI"). As a result, a warm white light with high CRI (e.g., greater than about 85) may be generated without using more than one phosphor or using more than one LED die.

From the foregoing, it will be appreciated that specific embodiments of the technology have been described herein for purposes of illustration, but that various modifications may be made without deviating from the disclosure. In addition, many of the elements of one embodiment may be combined with other embodiments in addition to or in lieu of the elements of the other embodiments. Accordingly, the disclosure is not limited except as by the appended claims.

We claim:

1. A light emitting device, comprising:
   a first semiconductor material;
   a second semiconductor material spaced apart from the first semiconductor material;
   an active region between the first and second semiconductor materials, the active region being configured to produce a light via electroluminescence; and
   a conversion material on the second semiconductor material, the conversion material containing aluminum gallium indium phosphide (AlInGaP) having a direct bandgap energy and an indirect bandgap energy that is equal to or lower than the direct bandgap energy, wherein the conversion material is doped with an N-type dopant.

2. The light emitting device of claim 1 wherein the conversion material includes a single layer of AlInGaP doped with at least one of silicon (Si), germanium (Ge), tin (Sn), phosphorus (P), arsenic (As), and antimony (Sb).

3. The light emitting device of claim 1 wherein the conversion material includes a plurality of layers of AlInGaP doped with at least one of silicon (Si), germanium (Ge), tin (Sn), phosphorus (P), arsenic (As), and antimony (Sb), and wherein the individual layers of AlInGaP have a dopant concentration different than other layers of AlInGaP.

4. The light emitting device of claim 1 wherein:
   the light emitting device has an emission direction;
   the conversion material includes a single layer of AlInGaP doped with at least one of silicon (Si), germanium (Ge), tin (Sn), phosphorus (P), arsenic (As), and antimony (Sb); and
   the single layer of AlInGaP has a dopant concentration that continuously varies along the emission direction.

5. The light emitting device of claim 1 wherein the light produced by the active region comprises a first emission having a first wavelength, and wherein the conversion material is configured to absorb at least a portion of the first emission and produce a second emission having a second wavelength longer than the first wavelength.

6. A light emitting package, comprising:
   a housing having a support;
   a light emitting diode (LED) die carried by the support, the LED die having an active region configured to produce an emission via electroluminescence;
   a conversion material on the LED die, the conversion material containing aluminum gallium indium phosphide (AlInGaP) having a direct bandgap energy and an indirect bandgap energy that is no higher than the direct bandgap energy, wherein the conversion material is doped with an N-type dopant; and
   a phosphor encapsulating the LED die and the conversion material in the housing.

7. The light emitting package of claim 6 wherein:
   the LED die is configured to produce a first emission having a first wavelength;
   the conversion material is configured to absorb at least a portion of the first emission and produce a second emission having a second wavelength longer than the first wavelength; and
   the phosphor is configured to absorb at least a portion of the first and second emissions and produce a third emission with a third wavelength different than both the first and second wavelengths.

8. The light emitting package of claim 6 wherein:
the LED die is configured to produce a blue light;
the conversion material is configured to absorb at least a portion of the blue light and produce a red light; and
the phosphor is configured to absorb at least a portion of the blue and red lights and produce a yellow light.

9. The light emitting package of claim 6 wherein the conversion material includes a single layer of AlInGaP doped with at least one of silicon (Si), germanium (Ge), tin (Sn), phosphorus (P), arsenic (As), and antimony (Sb).

10. The light emitting package of claim 6 wherein the conversion material includes a plurality of layers of AlInGaP doped with at least one of silicon (Si), germanium (Ge), tin (Sn), phosphorus (P), arsenic (As), and antimony (Sb), and wherein the individual layers of AlInGaP have a dopant concentration different than other layers of AlInGaP.

11. The light emitting package of claim 6 wherein:
the light emitting package has an emission direction;
the conversion material includes a single layer of AlInGaP doped with at least one of silicon (Si), germanium (Ge), tin (Sn), phosphorus (P), arsenic (As), and antimony (Sb); and
the single layer of AlInGaP has a dopant concentration that continuously varies along the emission direction.

\* \* \* \* \*